US007000213B2

(12) United States Patent
Banerjee et al.

(10) Patent No.: US 7,000,213 B2
(45) Date of Patent: Feb. 14, 2006

(54) METHOD AND APPARATUS FOR AUTOMATICALLY GENERATING HARDWARE FROM ALGORITHMS DESCRIBED IN MATLAB

(75) Inventors: Prithviraj Banerjee, Glenview, IL (US); Alok Choudhary, Chicago, IL (US); Malay Haldar, Evanston, IL (US); Anshuman Nayak, Evanston, IL (US)

(73) Assignee: Northwestern University, Evanston, IL (US)

( * ) Notice: Subject to any disclaimer, the term of this patent is extended or adjusted under 35 U.S.C. 154(b) by 67 days.

(21) Appl. No.: 09/770,541

(22) Filed: Jan. 26, 2001

(65) Prior Publication Data

US 2004/0019883 A1  Jan. 29, 2004

(51) Int. Cl.
  G06F 17/50  (2006.01)
  G06F 9/45  (2006.01)

(52) U.S. Cl. ................. 716/18; 716/3; 716/4; 717/152; 717/150; 717/159; 717/140; 717/141

(58) Field of Classification Search ............. 716/1–15, 716/18; 717/114–119, 136–161
See application file for complete search history.

(56) References Cited

U.S. PATENT DOCUMENTS

| 5,440,244 A | * | 8/1995 | Richter et al. ............... 326/37 |
| 5,535,342 A | * | 7/1996 | Taylor ....................... 710/315 |
| 6,226,776 B1 | * | 5/2001 | Panchul et al. ............... 716/3 |
| 6,233,540 B1 | * | 5/2001 | Schaumont et al. .......... 703/14 |
| 2002/0100029 A1 | * | 7/2002 | Bowen ....................... 717/140 |

FOREIGN PATENT DOCUMENTS

JP  10078973 A  *  3/1998

OTHER PUBLICATIONS

P. Banerjee, N. Shenoy, A. Choudhary, S. Hauck, C Bachmann, M. Haldar, P. Joisha, A. Jones, A. Kanhare, A. Nayak, S. Periyacheri, M. Walkden, D. Zargtsky; A MATLAB Compiler For Distributed, Heterogeneous, Reconfigurable Computing Systems, Proc. IEEE Symposium on Field-Programmable Custom Computing Machines, FCCM 00, Apr. 2000, 10 pages, Electrical and Computer Engineering ; Northwestern University, Evanston, IL-60208-USA.

Malay Haldar, Anshuman Nayak, Alok Choudhary and Prith Banerjee: Automated Synthesis Of Pipelined Designs On FPGAS For Signal And Image Processing Applications Described In MATLAB; Proc. of Asia Pacific Design Automation Conference (ASP-DAC) Jan., 2001; 4 pages ; MACH Design Systems, Inc. Schaumberg, IL USA.

Malay Haldar, Anshuman Nayak, Alok Choudhary and Prith Banerjee: FPGA Hardware Synthesis From MATLAB; VLSI Design Conference, Bangalore, India; Jan. 2001, 8 pages, Center For Parallel and Distributed Computing, Northwestern University, Evanston, IL 60208-3118 USA.

* cited by examiner

*Primary Examiner*—A. M. Thompson
*Assistant Examiner*—Chris C. Chu
(74) *Attorney, Agent, or Firm*—The Law Office of Deepti Panchawagh-Jain

(57) ABSTRACT

Digital circuit is synthesized from algorithm described in the MATLAB programming language. A MATLAB program is compiled into RTL-VHDL, which is synthesizable using system-specific tools to develop ASIC or FPGA configuration. Intermediate transformations and optimizations are performed to obtain highly optimized description in RTL-VHDL or RTL Verilog of given MATLAB program. Optimizations include levelization, scalarization, pipelining, type-shape analysis, memory optimizations, precision analysis and scheduling.

20 Claims, 20 Drawing Sheets

Synthesis flow.

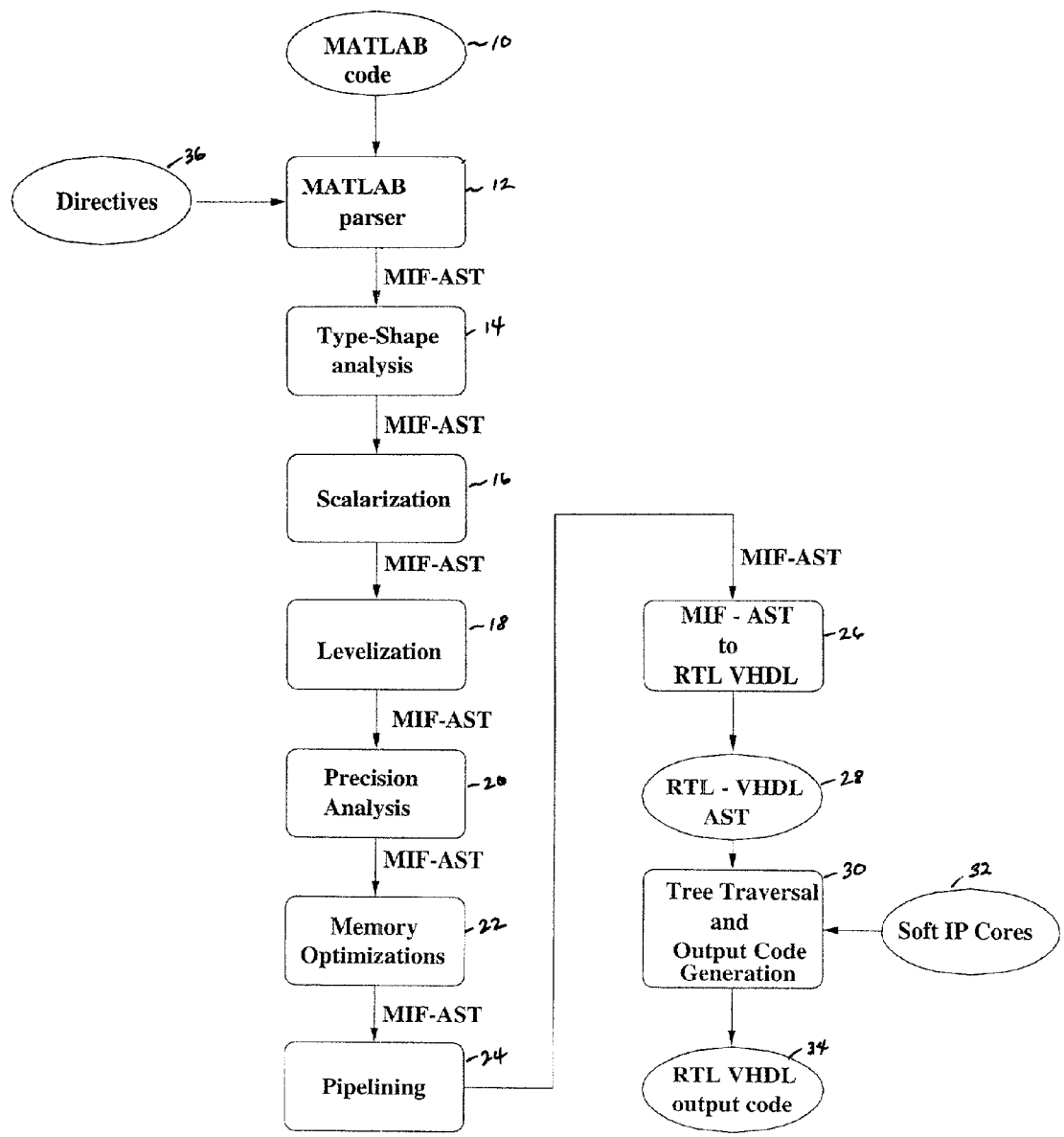
Figure 1: Synthesis flow.

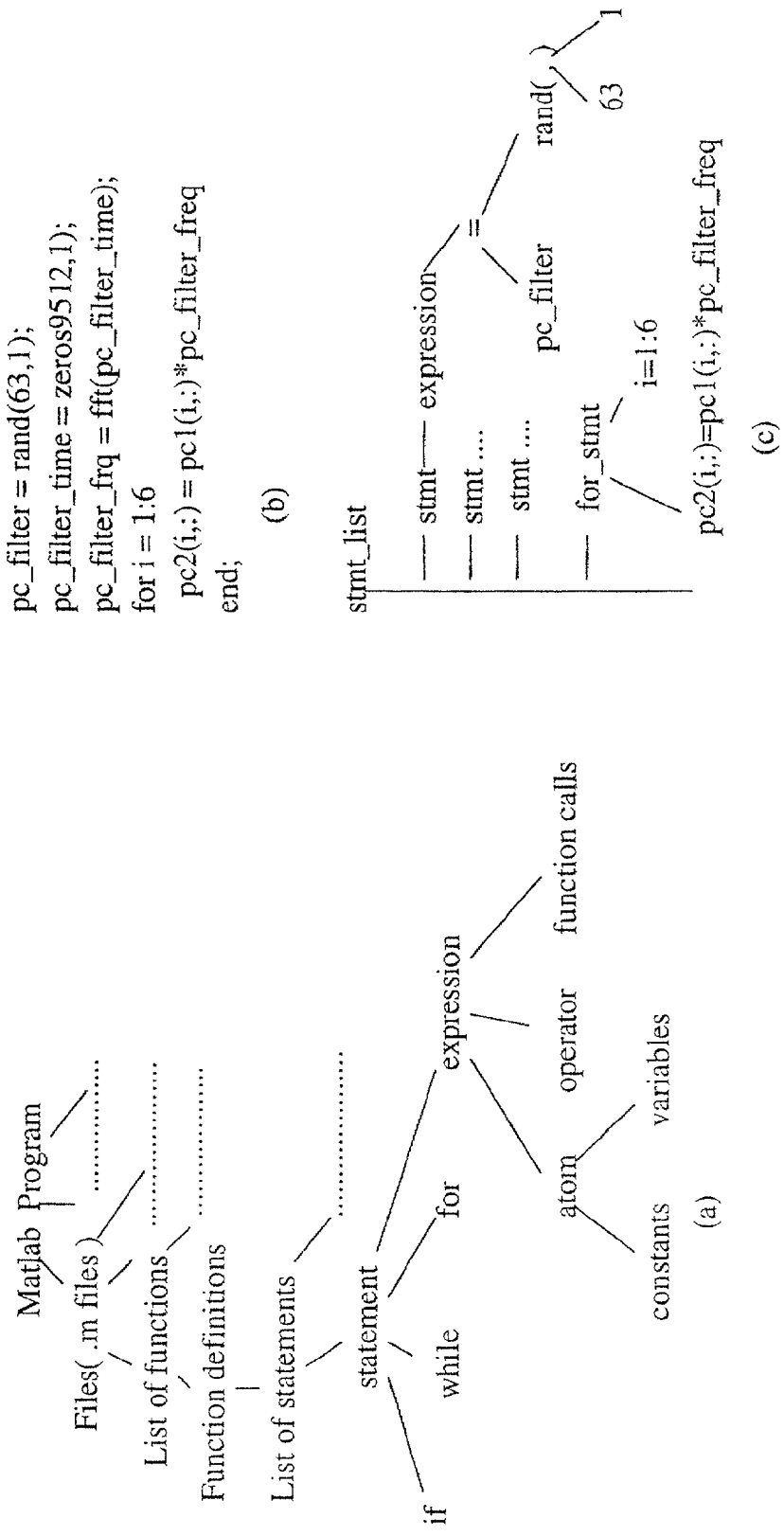
Figure 2: Abstract Syntax Tree: (a) The hierarchy captured by the formal grammar (b) A sample code snippet (c) Abridged syntax tree for the code snippet.

Unlevelized a = b * c * d ;

j = j + a;

i = i + 1;

state 1 :
    a = b * c * d;

state 2 :
    j = j + a ;

state 3 :
    i = i + 1 ;

clock period determined by the longest state

Execution time = 3 X 30 = 90ns

Levelized t1 = b * c ;

t2 = t1 * d;

j = j + t2 ;

i = i + 1;

state 1 :
    t1 <= b * c;

state 2 :
    t2 <= t1 * d;

state 3 :
    j <= j + t2 ;

state 4 :
    i <= i + 1 ;

longest state reduced by levelization

Execution time = 4 X 15 = 60ns

Time to multiply : 15ns
Time to add : 10ns
Execution time = Number of States X Clock Period Figure 3: Levelization improves clock period.

```
a = 1 ;
b = 1 ;
c = a + b ;
c = c + 1 ;
```

(a)

```
when state 1 =>   a <= 1 ;
                  next_state <= state 2 ;
when state 2 =>   b <= 1 ;
                  next_state <= state 3 ;
when state 3 =>   c <= a + b ;
                  next_state <= state 4 ;
when state 4 =>   c <= c + 1 ;
```

(b)

Figure 4: (a) Simple MATLAB statements. (b) State machine that steps through the statements sequentially.

```
if( x )
    a = b + 1;
else
    a = b - 2;
end ;
c = a + 1 ;
```

(a)

```
when state 1 =>   if( x ) then
                      next_state <= state 2 ;
                  else
                      next_state <= state 3 ;
when state 2 =>   a <= b + 1 ;
                  next_state <= state 4 ;
when state 3 =>   a <= b - 2 ;
                  next_state <= state 4;
when state 4 =>
                  c <= a + 1 ;
```

(b)

Figure 5: (a) Conditional MATLAB code (b) State machine for Conditional Code.

```
for i = 1 : 256
    a = a + i ;
end ;
```

(a)

```
when state 1 => i <= 1 ;
               next_state <= state 2 ;
when state 2 => if( i <= 256 ) then
                    next_state <= state 3 ;
                else
                    next_state <= state 5;
                endif ;
when state 3 => a <= a + i ;
               next_state <= state 4 ;
when state 4 => i <= i + 1 ;
               next_state <= state 2 ;
when state 5 => [ next statement after loop ]
```

(b)

Figure 6: (a) A MATLAB *for* loop (b) State machine for *for* loop.

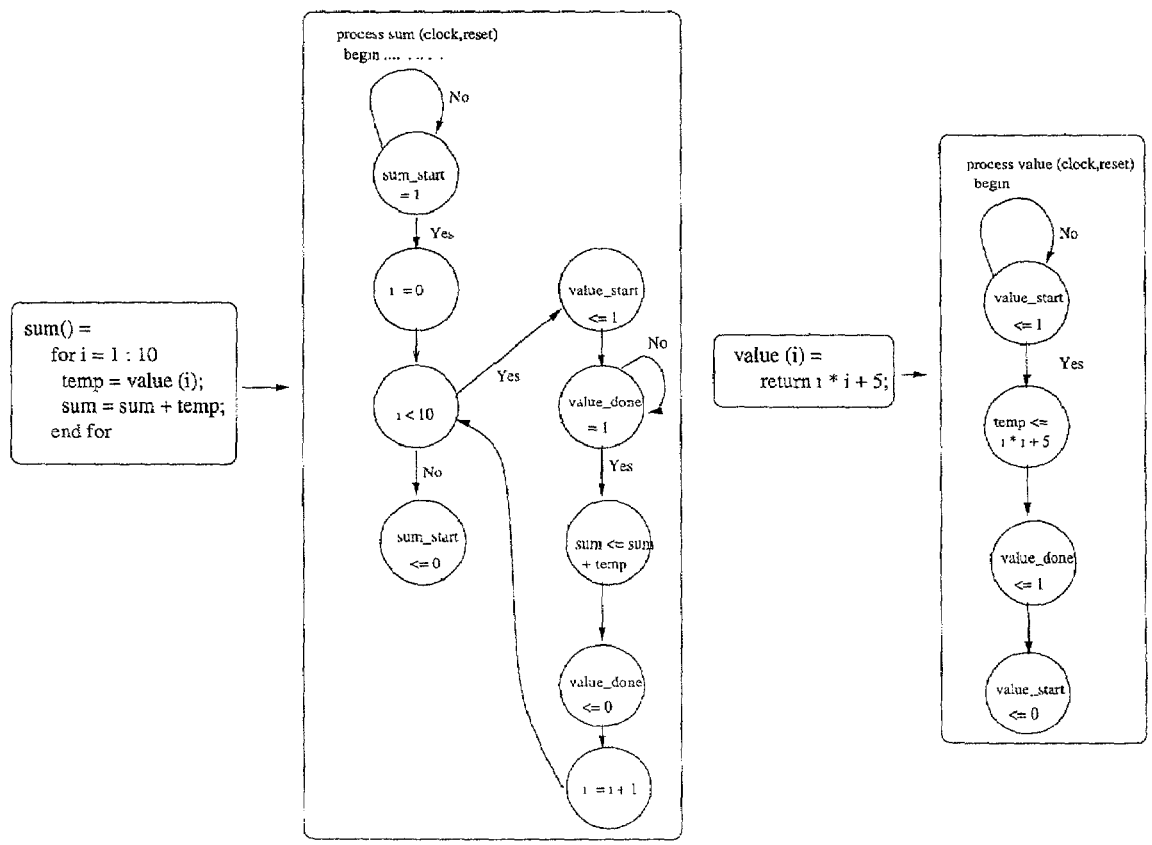
Figure 7: State machine representation of a function call in MATLAB a[ i + 1 ] = b + c ;

|
Levelization
↓ t1 = b + c ;
t2 = i + 1;
a[ t2 ] = t1 ;

```
when state 1 => t1  <= b + c ;
                next_state <= state 2 ;
when state 2 => t2 <= i + 1 ;
                next_state <= state 3 ;
when state 3 => mem_request <= '0' ;
                mem_write_enable <= '0' ;
                next_state <= state 4 ;
when state 4 => mem_address <= Base_a + t2 ;
                mem_data_out <= t1 ;
                next_state <= state 5 ;
when state 5 => if( mem_grant = '0' ) then
                    next_state <= state 6;
                else
                    next_state <= state 4 ;
                endif;
```

( a )                                    ( b )

Figure 8: (a) Array statement in MATLAB and its levelization (b) VHDL corresponding to the MATLAB code. The signals *mem_request, mem_data_out, mem_grant, mem_write_enable* and their particular states and assignments are specified in an external file read by the compiler. *Base_a* is a constant denoting the starting address of the array *a* in memory.

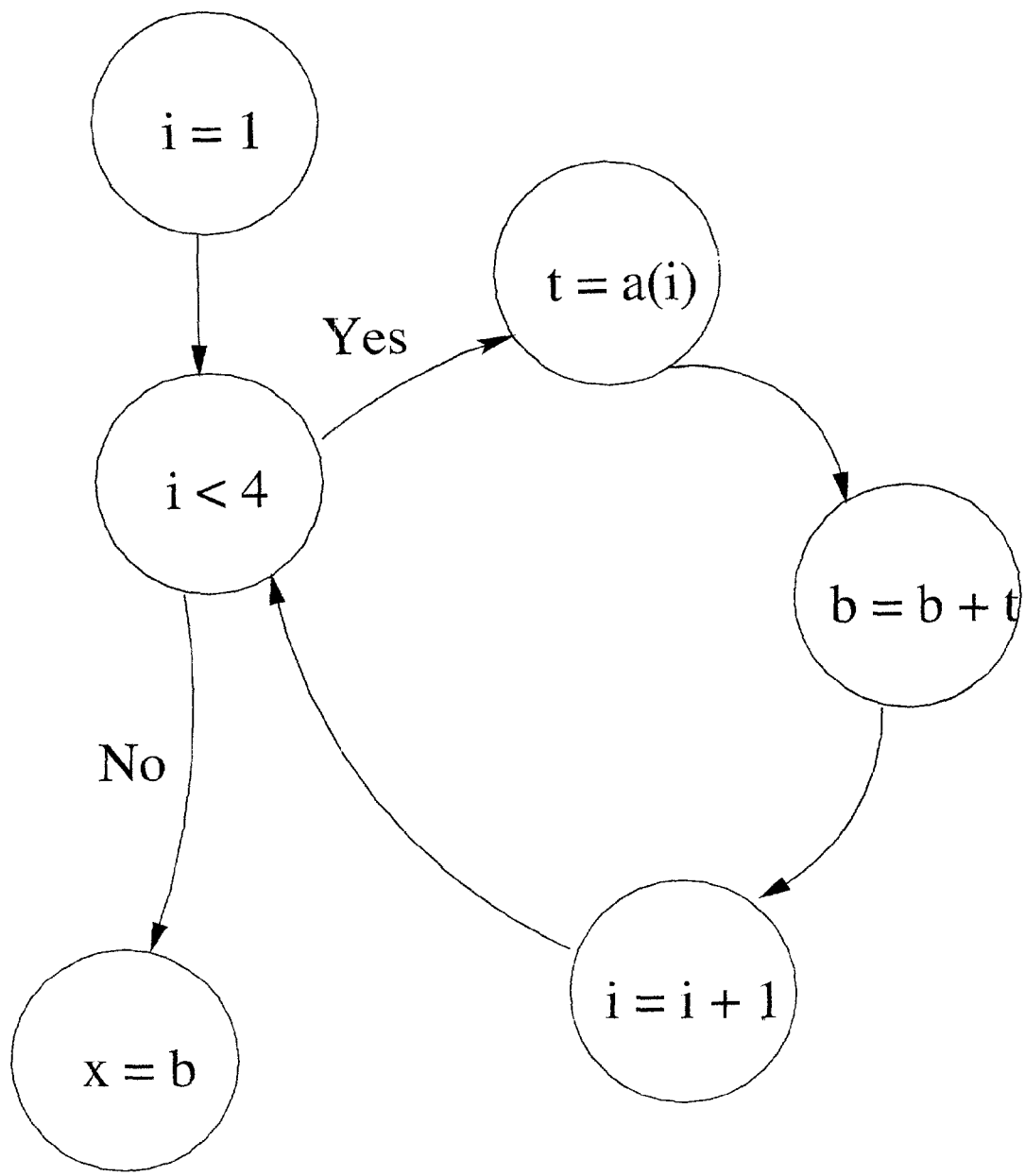
Figure 9: FSM Representation of a code section

```
Algorithm 1    architecture ...
   process ...

if reset = '1' then
           ...
       elsif rising_edge(clock)
           case control is
               when state1 =>
                   i := 1;
                   control <= state2;
               when state2 =>
                   if (i < 4) then
                   ....
                   else
                   ....
                   endif;
               when state3 =>
                   t := a(i);
                   control <= state4;
               when state4 =>
                   b := b + t;
                   control <= state5;
               when state5 =>
                   i := i + 1;
                   control <= state2;
```

Figure 10: VHDL code generated for the above FSM over manual design or design at a low level of algorithm description (e.g., directly in VHDL).

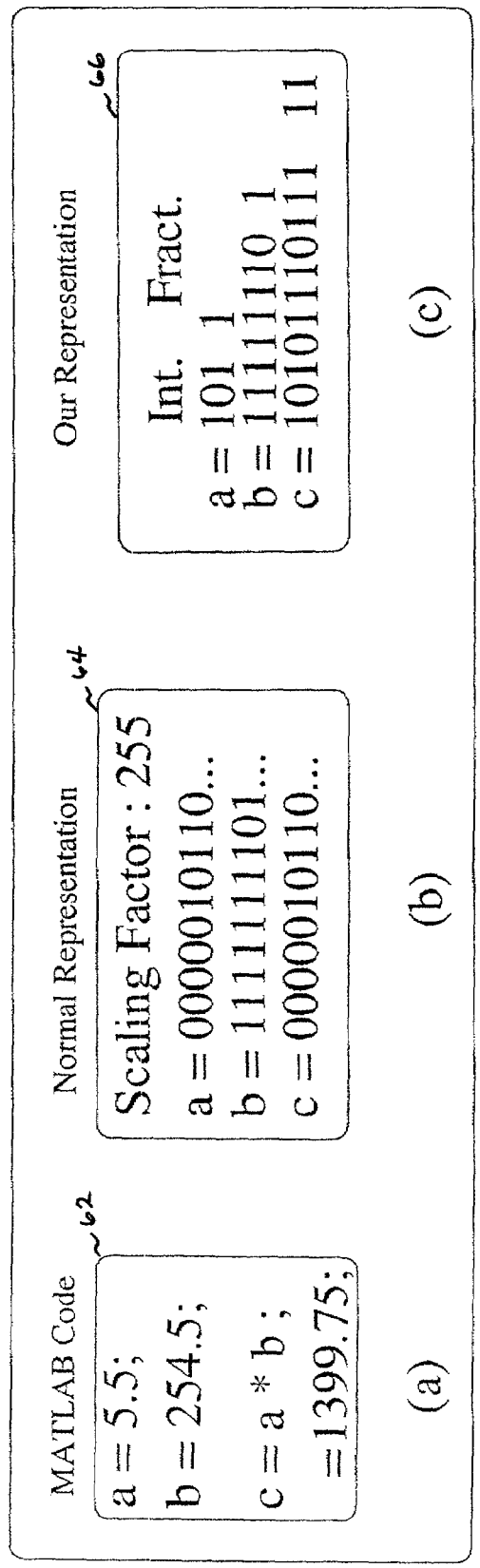
Figure 11: Representation of Real Variables

Figure 12: Exxample showing loop unrolled for Memory Packing

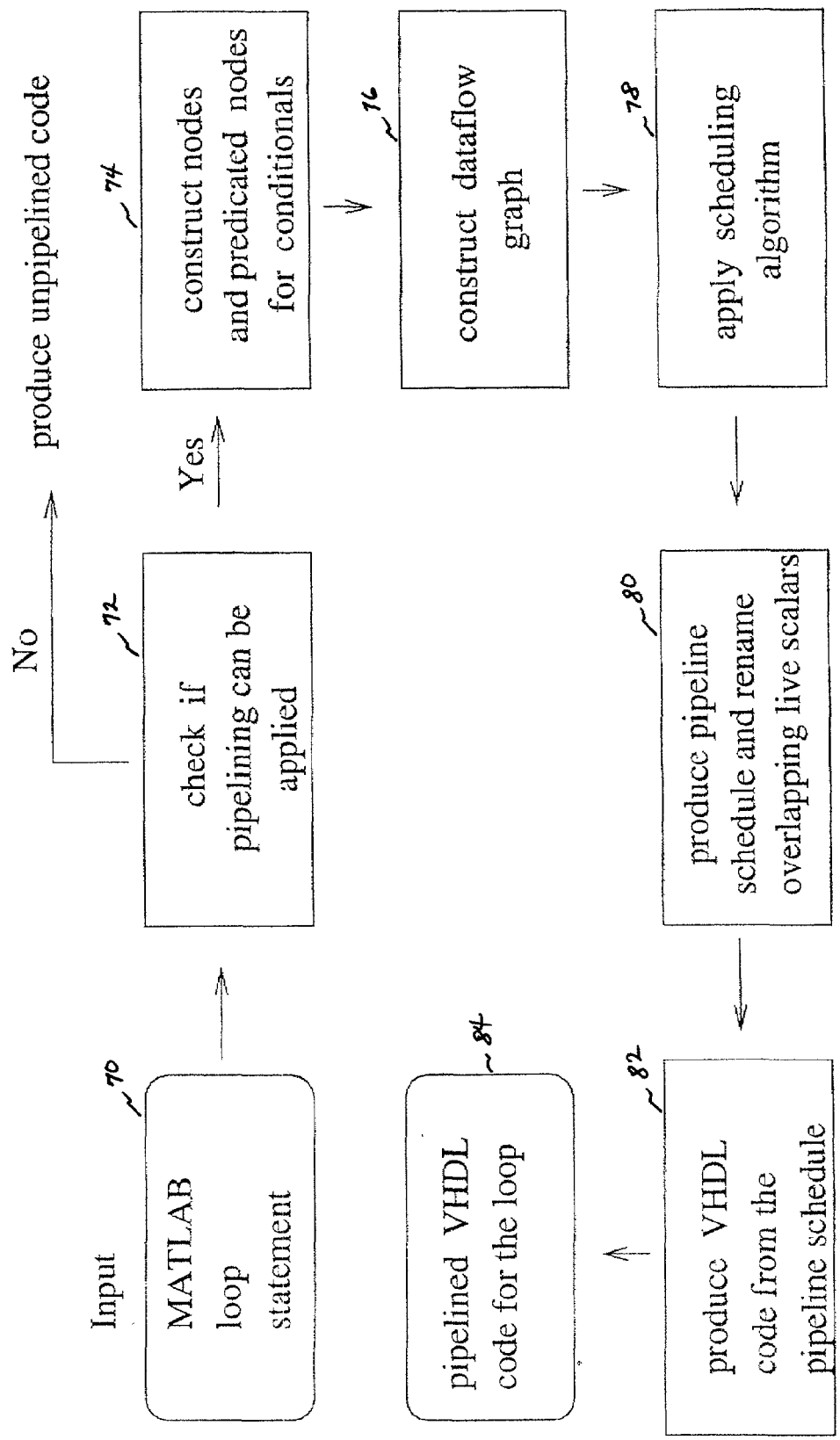
Figure 13: Overall framework for pipelining optimizations

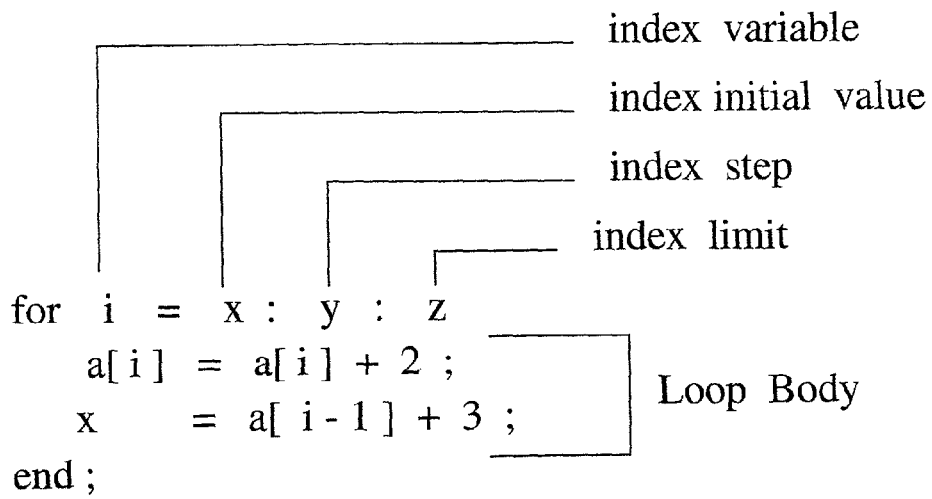
Loop Statement
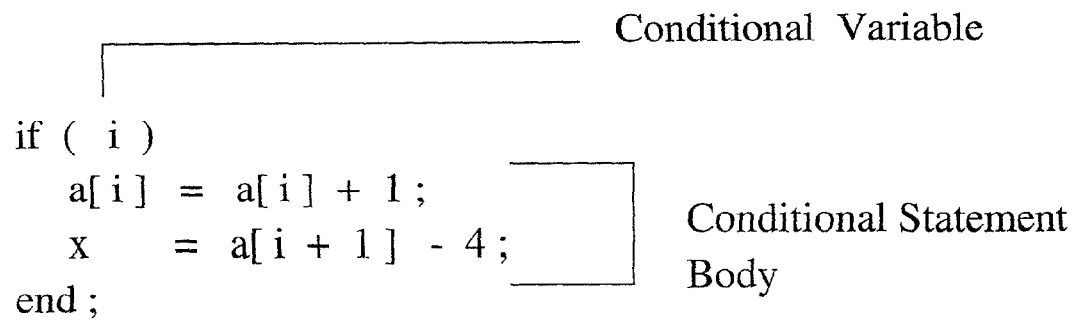
Conditional Statement
Figure 14: Illustration of Terms used in pipelining framework Simple Statements
```
x = x + 1 ;
```
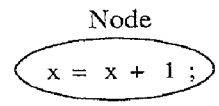
Conditional Statements
```
if( a )
    x = x + 1 ;
else
    x = b * 2 ;
end ,
```
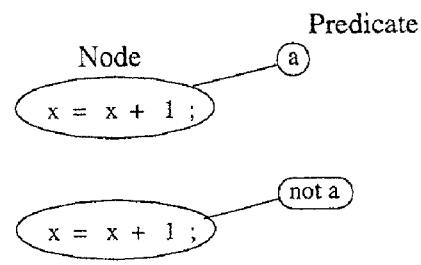
Nested Conditional Statements
```
if( a )
    if( t )
        x = x + 1 ;
    end ,
else
    if( k )
        x = 2 * y ;
    else
        g = g + 1 ;
    end ;
end;
```
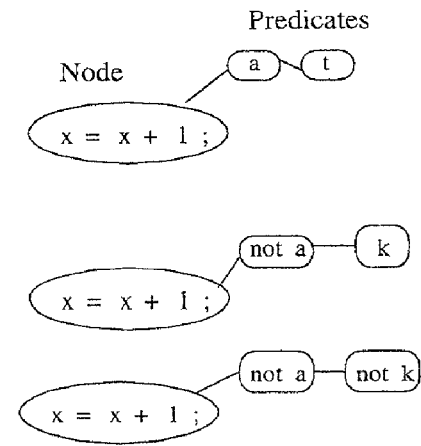
Figure 15: Illustration of Construction of nodes from MATLAB statements Example Memory Access Specification File Read s1 : mem_request <= '0';
     mem_write_enable <= '0';

s2    mem_address <= [ MEMADDRESS ];

s3 s4    [ MEMDATA ] <= mem_data_in

Example Array Access Statement x := a( i, j, k );      % a is a 256 X 256 X 256 array s1 :  ad_temp3 := j * 256 * 256 ;          ⎤
s2 :  ad_temp2 := ad_temp3 + j * 256 ;     ⎬ Address Calculation
s3 :  ad_temp1 := ad_temp2 + k ;           ⎥
s4    array_address := BaseAddress_a + ad_temp1 ; ⎦ s5    mem_request <= '0' ;                 ⎤
      mem_write_enable <= '0' ;            ⎥
s6    mem_address <= array_address ;       ⎬ Memory Interface Specific Signals
s7                                         ⎥
s8    x := mem_data_in ;                   ⎦

Figure 16: Example of node construction for array access statements

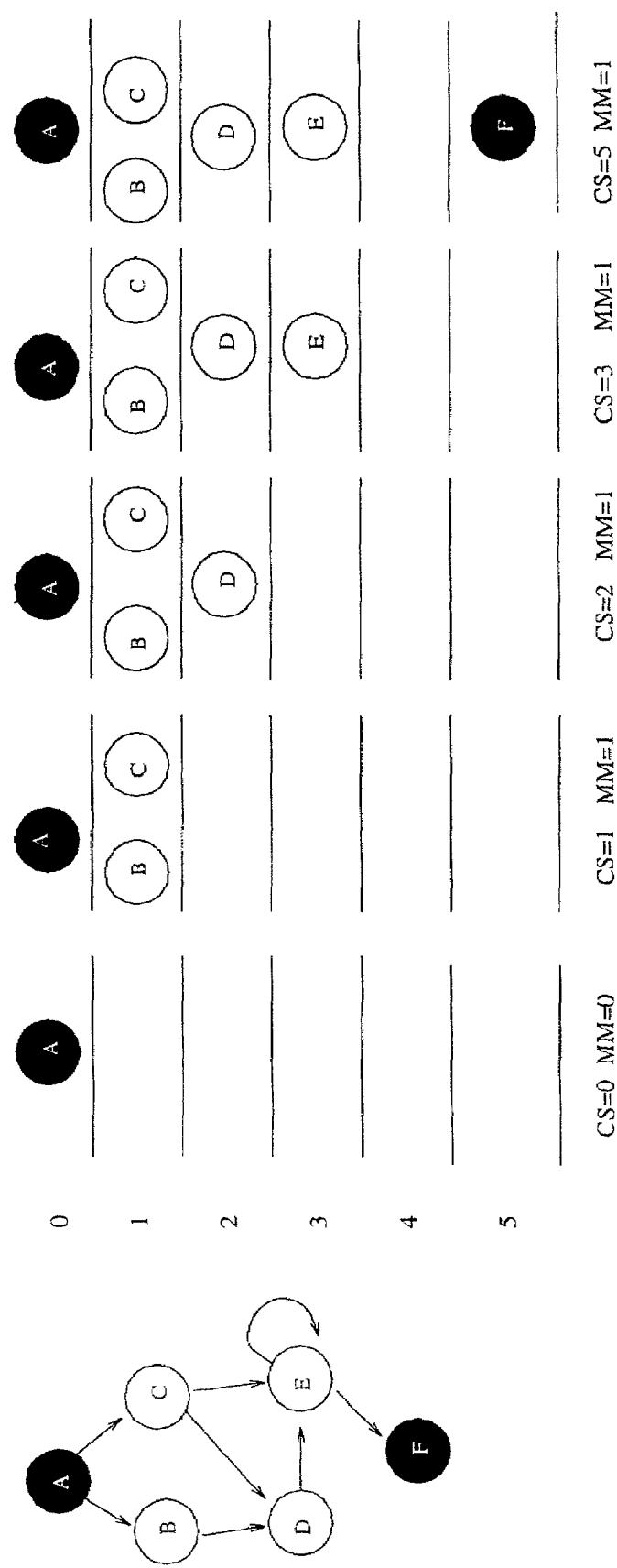
Figure 17: An illustration of pipeline method

Loop Body Schedule                    Initiation Interval = 2 state 0        x = i + 1 ;            Index Variable    = i state 1        y = x * 2;    z = x + 6;

state 2        m = y + z , state 3        t1 = m * 4;    t2 = m * 8 ;

Pipeline Schedule

Copy 0
state 0        x = i + 1 ,
                                      ⎤
state 1        y = x * 2;    z = x + 6;    Initiation Interval = 2
                                      ⎦
                                          Copy 1
state 2        m = y + z ;            x = (i+1) + 1 ,
                                                              i replaced by ( i + 1 ).
state 3        t1 = m * 4, t2 = m * 8 ,    y = x * 2;    z = x + 6, state 4                               m = y + z , state 5                               t1 = m * 4,    t2 = m * 8 ;

Figure 18: Construction of pipeline schedule from loop body schedule

Loop Body Schedule s1    x = i + 1 ;
s2    y = i * 2 ;
s3    k = x + 3 ;

Pipeline Schedule

Copy 0      Copy 1
s1    x = i + 1 ;   ↑ x live range    Copy 2
s2    y = i * 2 ;     x = i + 1 ;   ↑ x live range
s3    k = x + 3 ; ↓   y = i * 2 ;     x = i + 1 ;   ↑ x live range
s4                    k = x + 3 ; ↓   y = i * 2 ;
s5                                          k = x + 3 ; ↓

Pipeline Schedule with Overlapping Live Scalars Renamed

Copy 0
s1    case mod_var is
         when 0 :   x0 = i + 1;
         when 1 :   x1 = i + 1;
         when 2 :   x2 = i + 1;
     end case ;
                               Copy 1
s2    y = i * 2 ;             case mod_var is
                                    when 0 :   x1 = i + 1;
                                    when 1 :   x2 = i + 1;
                                    when 2    x0 = i + 1;
                                 end case ;                                Copy 2
s3    case mod_var is                                                        case mod_var is
         when 0    k = x0 + 3;    y = i * 2 ;            when 0 :   x2 = i + 1;
         when 1 :   k = x1 + 3;                        when 1    x0 = i + 1;
         when 2 :   k = x2 + 3;                        when 2    x1 = i + 1;
     end case ;                                                          end case ;
s4                                   case mod_var is
                                    when 0    k = x1 + 3;     y = i * 2 ;
                                    when 1 :   k = x2 + 3;
                                    when 2 :   k = x0 + 3;
                                 end case ;
s5                                                                                    case mod_var is
                                                                                   when 0    k = x2 + 3;
                                                                                   when 1 :   k = x0 + 3;
                                                                                   when 2 :   k = x1 + 3;
                                                                                  end case ;

Figure 19: Renaming of scalars with live overlapping ranges in the pipeline schedule

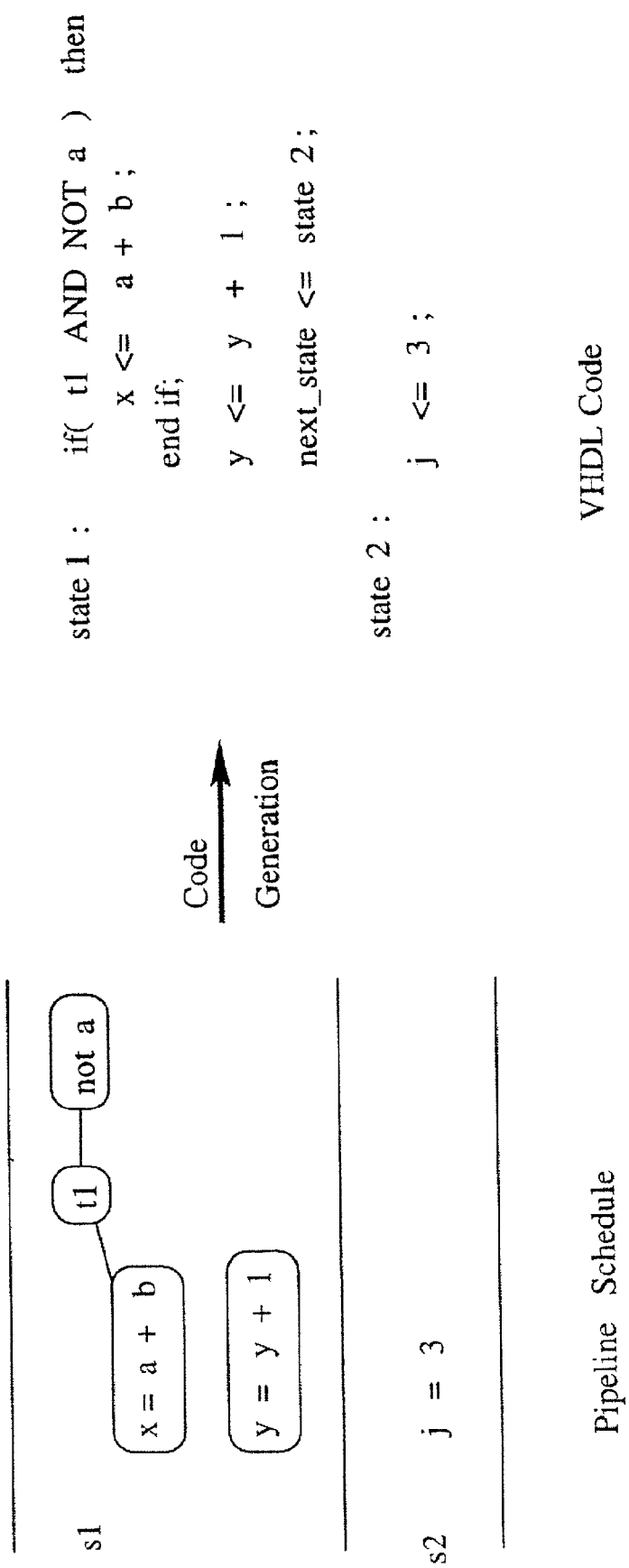
Figure 20: VHDL Code generation Illustration

METHOD AND APPARATUS FOR AUTOMATICALLY GENERATING HARDWARE FROM ALGORITHMS DESCRIBED IN MATLAB

STATEMENT REGARDING FEDERALLY SPONSORED RESEARCH OR DEVELOPMENT

This invention was made with Government support by Defense Advanced Research Projects Agency (DARPA) under Contract Number F30602-98-2-0144. The Government may have certain rights in the invention.

FIELD OF INVENTION

The invention relates to electronic design automation, particularly to the synthesis of hardware from a high-level behavioral description.

BACKGROUND OF INVENTION

Certain high-level languages, such as MATLAB, are used for prototyping algorithms in domains such as signal and image processing, simulation, analysis, etc. In particular, MATLAB provides users with extensive libraries of high quality routines, as well as high-level matrix-based syntax for expressing computations in a concise manner, i.e., than available from conventional languages, e.g., C, Fortran.

However, because MATLAB is an interpretive language, programs thereof incur high overhead during runtime. Thus, users developing applications for parallel heterogeneous systems often prototype algorithms in MATLAB, then manually develop algorithms in C, assembly language for DSPs (Digital Signal Processors), embedded processors or in VHDL (VHSIC Hardware Description Language) or Verilog for synthesis and implementation on FPGAs (Field Programmable Gate Arrays) or ASICS (Application Specific Integrated Circuits). Such a manual process is tedious, inefficient, time-consuming, expensive, and unoptimal. Moreover, as hardware designs become faster and include more devices, improved software is needed for hardware synthesis.

SUMMARY OF INVENTION

The proposed novel electronic design tool and methodology enables automatic synthesis from interpretive, dynamically-typed, algorithmic language, such as MATLAB™, developed and marketed by the MathWorks, Inc. of Natick, Mass. The use of "MATLAB" will refer to any interpretive, dynamically-typed, algorithmic language. A MATLAB program is compiled into a high-level format, such as RTL-VHDL (Register Transfer Level—VLSI Hardware Description Language) or RTL Verilog, which is synthesized using computer-assisted tools to develop ASIC masks or FPGA configurations. Present methodology and system employs MATLAB, having a large number of associated functions providing various constructs, such as operation on multi-dimensional arrays, function call statements, conditional statements, or loop statements.

Additionally, intermediate transformations and optimizations provide optimized RTLVHDL and RTL Verilog description of given MATLAB program. Optimization may include levelization, scalarization, pipelining, type-shape analysis, memory optimizations, precision analysis, or scheduling.

BRIEF DESCRIPTION OF DRAWINGS

FIG. 1 shows flow chart of preferred method generally according to one aspect of present invention.

FIG. 2 shows representative abstract syntax tree according to one aspect of present invention.

FIG. 3 shows representative levelization according to one aspect of present invention.

FIG. 4 shows representative translation of simple MATLAB program into finite state machine according to one aspect of present invention.

FIG. 5 shows representative handling of conditional code for input MATLAB program according to one aspect of present invention.

FIG. 6 shows representative handling of loops in input for MATLAB Program according to one aspect of present invention.

FIG. 7 shows representative function call in MATLAB and function translation into corresponding state machine according to one aspect of present invention.

FIG. 8 shows representative levelization and subsequent translation of array statement of MATLAB program according to one aspect of present invention.

FIG. 9 shows representative finite state machine code section according to one aspect of present invention.

FIG. 10 shows representative VHDL code generated for finite state machine according to one aspect of present invention. The corresponding Verilog code generation is similar.

FIG. 11 shows representative real variables according to one aspect of present invention.

FIG. 12 shows representative loop unrolled for memory packing according to one aspect of present invention.

FIG. 13 shows representative overall framework for pipelining optimization according to one aspect of present invention.

FIG. 14 shows representative terms for pipelining framework according to one aspect of present invention.

FIG. 15 shows representative construction of nodes from MATLAB statements according to one aspect of present invention.

FIG. 16 shows representative node construction for array access statements according to one aspect of present invention.

FIG. 17 shows representative pipeline method according to one aspect of present invention.

FIG. 18 shows representative construction of pipeline schedule from loop body schedule according to one aspect of present invention.

FIG. 19 shows representative renaming of scalars with live overlapping ranges in pipeline schedule according to one aspect of present invention.

FIG. 20 shows representative VHDL code generation according to one aspect of present invention. The corresponding Verilog code generation is similar.

DETAILED DESCRIPTION OF PREFERRED EMBODIMENT

FIG. 1 shows overview of computer-automated electronic design or compilation process, which may be implemented in one or more software programs and computers or processing elements provided stand-alone or in network or otherwise distributed configuration. According to one operational mode of present automated approach, one or more digital circuit or system may be synthesized or otherwise defined from algorithm described in MATLAB or other programming language. Preferably, MATLAB program is compiled into high-level code, such as Register Transfer Level (RTL)—Very High Speed Integrated Circuit (VHSIC) High Definition Language (VHDL) or RTL Verilog, which is synthesizable using system-specific tools to develop Application Specific Integrated Circuit (ASIC) masks, Field Programmable Gate Array (FPGA) configurations, or other circuit implementations.

As described further herein, intermediate transformations and optimizations may be performed to obtain highly optimized description in RTLVHDL or RTL Verilog of a given MATLAB program. Additionally, optimizations include levelization, scalarization, pipelining, type-shape analysis, memory optimizations, precision analysis, scheduling, and other operations.

As shown in FIG. 1, initially one or more input MATLAB program codes 10 are parsed or otherwise processed 12 using one or more directives 36 to build one or more Abstract Syntax Trees (AST) preferably according to the intermediate format (e.g., MATCH Intermediate Format (MIF)). Such an intermediate format may follow standard syntax information based on MATLAB grammar, as well as one or more explicit or implicit indications for design optimizations. Optionally, input code may contain user-specified directives 36 regarding types, shapes, and/or precision of arrays. Directives 36 are attachable to MIF nodes as annotations.

Then, the type-shape analysis and inference phase 14 is applied. Because, by default, MATLAB variables have no notion of type or shape, type-shape analysis phase 14 analyzes input program to infer type and shape of variables present. Next, the scalarization phase 16 is applied, where operations on matrices may be expanded into loops according to the internal format. When one or more optimized library functions is available for a particular operation one of the library functions is used instead. Further, after the scalarization step 16, levelization 18 may be applied, where one or more complex statements are brokendown into simpler representative statements. Scalarization 16 facilitates VHDL and Verilog code generation and/or optimizations.

Preferably, the transformation steps 12, 14, 16, 18 are performed on the MIF AST format, and the output of such transformations is also in an MIF AST format. Moreover, hardware-related optimizations may be performed subsequently on such MIF AST files. For example, the precision analysis or inference scheme 20 is applicable to find the minimum number of bits required to represent each variable in the MIF AST based on information available at compile time.

In addition, the memory optimization or transformation 22 may then be performed on MIF AST for optimization according to memory accesses present in the program as well as the characteristics of the external memory, i.e., when specified as an external input. Furthermore, the pipelining step 24 performs optimizations related to resources present and opportunities of parallel execution and pipelining available. Then, preferably, the MIF AST is translated 26 using RTL-VHDL or RTL Verilog grammar into an RTL-VHDL AST or an RTL Verilog AST 28. Finally, using one or more software intellectual property cores 32, tree traversal 30 of the optimized RTL-VHDL or RTL Verilog AST produces output code in RTL-VHDL or RTL Verilog 34.

The input MATLAB code is parsed using a formal grammar, and an abstract syntax tree is generated. FIG. 2 shows a graphical view of (a) the hierarchy captured by representative grammar, (b) a sample code snippet, and (c) an abridged syntax tree for code snippet. Parsing and generation of AST are shown, such that MATLAB program is thereby provided using one or more .m" files. Each of such files may include one or more functions, wherein each listed function is defined per one or more statements listed. For example, each statement can contain "if", "while" or "for" statement or a simple expression; each expression may correspond to an "atom", "operator", or a function call. Each atom can be constant or a variable. FIG. 2(b) shows a sample MATLAB program, and FIG. 2(c) shows the main components of the AST for the sample program.

Using user-specified directives 36, type-shape information can be provided to the present compilation process; and such directive information may be parsed for annotating the MIF AST. Hence, after the MIF AST is constructed, the compilation process invokes a series of phases, each phase processing the MIF AST, either by modifying or annotating the MIF AST with more information. Directives 36 serve as comments to the compiler, and thus may be used to allow user to provide more information to compiler about program to facilitate optimizations. For example, directive 36 may indicate when design information array includes items whose size at most will be a byte, such that compiler may optimize memory usage accordingly to reduced design space.

Using MATLAB-type program, type-shape analysis 14 of variables is accomplished effectively by carrying explicit data type and shape information, although MATLAB processing is generally interpretive, whereupon types of variables could be known at runtime before executing a statement. Hence, to compile and synthesize program written in MATLAB, such that maximum information about type and shape of arrays in particular, and of variables in general, are determined appropriately, algebraic framework is thereby provided to determine type and shape of arrays preferably at compile time. Representative directives (e.g,. constraints, assertions, and hints) are provided as follow:

1. Constraint directives: State delay and throughput constraints at different levels of granularity. Constraint directives include resource constraint directives that specify resources available and their costs., e.g., %!match DELAY 200 ms suggests to compiler maximum delay of 200 msec to complete an entire application task.
2. Assertions: Include assertions made about input MATLAB code, such as variable type assertions, value assertions, etc., e.g., %!match BITS(32) defines a 32-bit variable; helps invoke libraries for FPGAs or synthesize hardware with the right precision, but no more than necessary.
3. Hints: Suggestions to compiler, likely to improve performance, including parallelism hints, data distribution hints, platform preference hints, variable type/shape hints etc., e.g., %!match DISTRIBUTE foo(CYCLIC(4), CYCLIC(4)) ONTO PROC(2,2) defines distribution of the variable foo on a 2×2 processor mesh.

Scalarization 16 is applied to the MATCH intermediate format description for performing source-to-source transformation to a target language. In such step, the target language is typed statically, and only elemental operations are supported.

In preferred implementation, a high-level programming language is used, such as MATLAB, which is array-based, having built-in functions for supporting array operations. Moreover, to generate therefrom the low-level format, such as VHDL AST or Verilog AST, the corresponding MATLAB MIF AST is scalarized. Thus, to scalarize MATLAB vector constructs, array shape and size are determined; although MATLAB is dynamically typed and may not ordinarily provide explicit basic data type and shape declarations. Accordingly, in accordance with one aspect of present invention, type-shape analysis 14 is applied.

Generally, translation is provided from one language having array constructs (e.g., MATLAB) to another language having loops and scalar operations (e.g., C), and scalarization may be performed upon intermediate format description (e.g., MIF-AST) to enable translation of array statements into loop form.

In particular, during operation of present methodology, given certain types and shapes of variables, for example, C-code may be generated to declare variables and corresponding statements. In this regard, compiler software may infer loop bounds for loops corresponding to vector statements provided preferably in MATLAB Following is a sample MATLAB code:

a=b+2;

where the correspondingly generated C code is:

float a[100; 200]; b[100; 200];

int i; j;

for(i=0; i<100; i++)

for(j=0; j<200; j++){ a[i][j]=b[i][j]+2;

}

Preferably, the hardware description language, such as VHDL, is used for design file description for simulation and synthesis in accordance with present methodology; although certain constructs, e.g., file operations, assertion statements, or timing constructs may not be supported. Moreover, certain tools may require a specific coding style for generating hardware accurately. Hence, to enhance tool portability, the present methodology provides compiler that generates VHDL code that is compatible with various commercially-available high-level synthesis tools.

Furthermore, the VHDL AST format may be used, in addition to AST based on MATLAB grammar, to simplify final VHDL code generation, as well as enable hardware-related optimizations, like memory pipelining. Thus, during such optimizations, clock cycles and states may be introduced. Further, to generate VHDL AST, corresponding MATLAB AST is assumed to be scalarized, since MATLAB language is array-based.

Levelization 18 is applied to scalarized 16 MIF AST, modifying the AST to have statements in the three operand format only. Advantageously, different operators are spread across different states, so that optimal clock frequency is obtained, as shown, for example, in FIG. 3. Levelization enables optimizations, such as operator chaining, resulting in a further optimized clock cycle. Since statements having large number of operations are broken down to a series of statements having one operation only, resources may be reused, as these smaller statements can be distributed across different clock cycles.

Scalarization and levelization steps 16, 18 transform input MATLAB code, so that such code includes a series of simple statements with constructs. Like conditionals, loops and function calls. FIGS. 4*a*–*b* show the transformation of a series of simple MATLAB statements into VHDL statements that are executed sequentially. The corresponding Verilog statements are similar but are not shown. Here, the state machine is synthesized by putting each simple statement in a state, and transitions between the states are arranged so that the states are traversed sequentially, i.e., one after another in order of their appearance in the MATLAB code. This sequencing results in modeling each state to operate in a clock cycle, while movement between the states is decided by the transition signal. FIG. 10 shows the VHDL code generated for a representative finite state machine. The corresponding Verilog code is similar.

Next, during the synthesis flow, the compiler synthesizes one or more state machines traversing states for simple statements. For conditionals, a series of states is produced initially corresponding to the 'then' and 'else' body parts. A state is constructed to evaluate the condition, and transitions from the initial state are arranged so that states corresponding to the then-body are traversed when the condition is true, and states corresponding to else-body are traversed when the condition is false; see FIGS. 5*a*–*b*, for example.

Similar to conditional code, loops are handled such that the state machine is constructed for a body of the loop initially. Then, states are synthesized for initializing the index variable, incrementing such index variable, and checking exit condition of the loop. States are attached around the states for loop body, as shown in FIGS. 6*a*–*b*.

Moreover, in the synthesis process, each function call in the MIF AST is mapped to a state machine in the VHDL or Verilog AST; FIG. 7 shows the state machine representation for a MATLAB code with a function call. Each function is declared as a process, and the arguments of a function are declared as signals. The function arguments are passed by assigning variables at the calling site to signals corresponding to arguments of the function. To assign variables at the caller site, signal names corresponding to arguments of the function and their ordering are know a priori. In this manner, an earlier pass is made generating the symbol table entry corresponding to each function definition, assigning unique names to signals corresponding to the arguments. Each function has an in:start signal and an out:done signal. The execution of the function is started by calling the function by assigning values to the signals corresponding to the arguments and making high the in:start signal for the called function. The calling function waits for the out:done signal of called function to be high, after which the output signal of the called function holds valid values. Hence, advantageously, resources are shared between each function call, and the present approach is applicable to exploit functional parallelism. Preferably, since different processes may run concurrently, multiple processes may not write to shared signals simultaneously.

Present compiler declares scalars as variables to facilitate movement of operations across states by optimization phases. Variables corresponding to function arguments are declared signals to be visible outside the process corresponding to the function. Other signal declarations include signals corresponding to memory interface.

Furthermore, the compiler may map arrays to memory; specification of memory access characteristics is provided as an input. The compiler instantiates registers for scalars, e.g., on FPGAs. The levelization phase ensures that each statement has at most one memory access with no other associated operations. The exact mechanism and signals involved in accessing memory is specified in a file read by the compiler, which uses such information to produce states to read/write memory corresponding to each array access that appears in levelized and scalarized MATLAB code; FIGS. 8*a*–*b* shows an example.

Precision analysis 20 determines the minimum number of bits required to represent a variable. Since number of required bits relates to maximum and minimum value that variable can attain through program run, precision analysis 20 can be performed by value range propagation. Levelization serves to formulate series of transformations applicable on statements to infer the value ranges.

Moreover, real variables are represented in a way such that operations are accomplished using integer operators; both operands for any operator are integer or real. In particular, to avoid converting induction variables inside loops to be type promoted to real numbers, so-called temporaries are used. Because the MATLAB language is typed dynamically, without ordinarily representing type and shape of variables, data flow graph is used with single assignment property.

Precision analysis 20 uses an array-based single static assignment (SSA) representation where each array element that is written into more than once is renamed. Advantageously, increase in the value range of an individual array element does not increase the value range of the entire array, so that precision inferencing becomes more accurate. Precision analysis phase 20 ends once value range of all the variables stabilize. Precision information can be derived from target architecture for which VHDL is generated. Value range propagation benefits optimization approaches, such as constant propagation and dead code elimination.

Preferably, on reconfigurable computing platforms, fixed point representations may be used, since the dynamic range of variables in image and signal processing applications is relatively small. Further, real number representations are scaled down to a value between −1 and +1 so that the number of bits required to represent a real number is related directly to its resolution or number of digits after decimal point.

FIG. 11a shows a MATLAB code 62 for multiplication of two real numbers. FIG. 11b shows the normal representation code 64 if both numbers are scaled down by the largest integer value of 255 to get the value within −1 and =1; the number of decimal bits needed to represent the transformed number may be as high as 32 bits, i.e., to limit error in calculating the result, resulting in instantiation of a 64-bit integer multiplier. Further, since variables in the input code have to be scaled down by the maximum integer, this approach results in real variables requiring 32 bits leading to a large consumption of processing resources. Thus, in accordance with one aspect of the present invention, real numbers are represented by integer and fractional parts. FIG. 11c shows the resulting transformed code 66. Transformation results in instantiation of a 13-bit multiplier, with no error in output calculation.

As described herein, the number of bits required to represent the integral part of a real number can be deduced from the precision analysis algorithm based on value range propagation. Resolution or minimum number of bits required for the fractional part can be inferred after the error analysis phase. Preferably, real variables have the same number of bits for the fractional part; the number of resolution bits for real numbers is inferred when user specifies using directives; user uses output statement, (e.g., printf,) and defines output resolution; or compiler assumes that since the code was to be executed as sequential MATLAB code which has a default resolution of 4, output variables have a resolution of 4, and back propagate such information in error analysis phase to determine resolution of intermediate real variables. Foregoing analysis provides minimum number of bits required to represent fractional part of real numbers, while precision analysis algorithm in previous section provides minimum number of bits required to represent integer part of real number.

Additionally, optimal packing order (PO) algorithm is provided for each array, where PO is defined by the maximum number of array elements that can be packed in each memory location. The minimum number of bits required by array elements can be inferred from precision analysis 20. Since most of images read from MATLAB are stored in 2-dimensional arrays, the precision of input images is inferred by parsing input matrices to obtain the maximum value of various array elements. FIG. 12 shows a loop described in MATLAB. Since memory packing involves unrolling the loop to find more consecutive array element accesses, dependence-analysis phase may be used to determine any loop carried dependencies.

Preferably, for memory optimization 22, memory packing is performed on the innermost loop of a deeply nested loop or innermost dimension of array access, and thus, analysis can be done by the greatest common denominator test (GCD). Since memory packing requires consecutive array accesses across loops, array access patterns are determined across loop iterations. Unroll factor, i.e., number of statements unrolled, of each memory access in a loop is defined by the number of array element accesses across loops located in the same physical memory location. To minimize number of memory accesses, the loop is unrolled by the maximum unroll factor.

Additionally, pipelining 24 optimizes the number of cycles taken by a design to execute input application, as shown in FIG. 13. Upon input of a MATLAB loop statement 70, the given series of nested loops, check 72 is performed on innermost loop body to determine if the pipelining method is applicable. If it is determined that the inner loop body is suitable for pipelining, then the pipelining algorithm is applied 74. Initially, the inner loop body is located in the AST, then the nodes are constructed corresponding to statements in the loop body. Predicated nodes are constructed for conditional statements present in the loop body. A data flow graph utilizing nodes corresponding to statements of the loop body is constructed 76. Scheduling algorithm is applied 78 to the data flow graph. The schedule for loop body is used 80 to construct a schedule for the pipeline; scalars with overlapping live ranges in the pipeline schedule are renamed. Loop conditionals are produced 82 and VHDL or Verilog statements are generated 84 from the pipeline schedule.

Generally, the pipelining 24 step attempts to pipeline innermost loop in sequence of nested loops, according to two conditions: loop under consideration is innermost loop; and no statement in the loop body depends on data defined by a statement in an earlier iteration, but appears after inner loop body. Body of loop statement includes other statements, which may be of three: simple assignment statements, conditional statements, and loop statements, as shown in FIG. 14. Traversal of the AST is performed, and each loop statement is checked for nested loops. Simple assignment statements in the loop body are ignored. If a statement in the loop body is a conditional statement, then the body of the conditional statement is recursively traversed to check for the presence of loops.

If a loop statement is found in the loop body or by recursively traversing conditional statements in the loop body, the loop is judged to be an outer loop, and pipelining is not applied to such loops; else if no loop statement is found in the loop statement body or by recursively traversing conditional statements present in the loop body, then the loop is considered to be an innermost loop. Loops that originate from scalarization of matrix operations are marked to indicate that they do not have dependencies where statement in loop body depends on data defined by statements in earlier iterations, but appears after in loop body. For loops that do not originate from scalarization of matrix operations, GCD test is performed to check for the presence of dependencies.

Statements of the loop body are traversed one by one, and a node is constructed corresponding to each statement. Nodes are connected by dependency edges to form a dataflow graph. If conditional statements are present in a loop body, then a check is performed on the body of the conditional statement to ensure statements inside the conditional statement body do not modify any conditional variable of the conditional statement. If statements inside the body of a conditional statement modifies any conditional variables, then pipelining 24 is terminated. For statements inside the body of a conditional statement, nodes are created with predicates, e.g., 15.

During VHDL code generation corresponding to a particular node, produced VHDL code is guarded effectively by predicate expressions of such a node. For nodes corresponding to statements in the true path of the conditional statement, the predicate expression is the condition variable. For nodes corresponding to statements in the false path of the false conditional statement, the predicate expression is the negation of the condition variable. In case of nested conditional statements, the predicate expressions from higher nesting are concatenated to form the predicate expression of the node. For statements with array accesses, the procedure is slightly different; for array access statements, location of variable is computed first, i.e., for address calculation.

Then, after address is calculated, the series of signals are assigned specific to the memory interface in use. Given a multi-dimensional array access, a node is generated corresponding to the address calculation in each dimension. Signals assigned for memory access are specified in an external file read by compiler, and nodes are generated corresponding to each state defined in the external file.

Furthermore, to construct the dataflow graph, an auxiliary control flow graph is constructed initially. In the control flow graph, node "x" is made a predecessor of another node "y", if an execution path exists starting from the first node of the control flow graph that reaches the node "y" with node "x" immediately before in the path. After the control flow graph is constructed, for each node variable that the node defines, and the variables that the node uses are thereby determined. For each variable used by the node, the control flow graph is traversed upward, and all reaching definitions are located. A dependency edge is added from the node using the variable to all nodes with reaching definitions; such operation is applied to all nodes, and nodes along with the dependency edges define the dataflow graph.

The scheduling process is applied to the data flow graph, and assigns each node in the data flow graph a state number, then the initiation interval for the pipeline is determined. Initiation interval for a pipeline is the number of clock cycles between the initiation of consecutive iterations. Nodes correspond to statements of a loop body with state number assignments, is referred to as the schedule of the loop body. Nodes not dependent on any other nodes are considered initially for scheduling, and assigned state 0.

For a given node, once all the nodes that the node is dependent on are scheduled, such node is ready to be scheduled, and such node is assigned the current state number.

When all the nodes that are ready in a step are assigned, then the state number is incremented to the next value. Exception occurs while assigning a state to a node corresponding to a memory access. If the node corresponding to a memory access is ready, such node is not assigned immediately the current state number. For nodes corresponding to memory accesses, the state number is determined such that if is closest to the current state number, and that the state number modulo the number of memory accesses in loop body is different from all state numbers modulo the number of memory accesses in the loop body corresponding to memory access nodes for which states have been assigned at that point. Initiation rate of pipeline is set to number of memory accesses in loop body. An example of the process in work is shown in FIGS. 14–17 showing representative construction method statements.

In FIG. 17, the sample dependence graph of loop body to be pipelined is shown at left. Dark vertices denote memory references, while light nodes denote non-memory reference vertices; the initiation rate is 2. After placing first memory reference in state 0, second memory reference cannot be placed in state 4, although predecessors are assigned; This constraint is because 4 mod 2 is 0, and 0 mod 2 is also 0, which is assigned. So, the second memory reference is pushed to 5.

After the scheduling process assigns state numbers to all the nodes, pipeline is constructed. Here, L/I copies of the loop bodies are created, where L is length of the loop body schedule, and I is the initiation interval of the pipeline; see FIG. 18 for the representative pipeline schedule. L is defined by the largest state number assigned to any node, and I is equal to the number of memory accesses in the loop body; index variable corresponding to the loop is var. In ith copy of the loop body, var is replaced by (var+i), then copies of the loop body are concatenated with an interval of I between the successive copies.

Next, all scalar variables in pipeline schedule are located, and the nodes defining scalars and the nodes using scalars are determined. States between the definition and use of scalars constitute scalar live range. Live range of each variable in each copy of the loop body that comprise the pipeline schedule is determined. Scalars are located for which the live range in one copy overlaps with the live range in another copy of the loop body. A new version is then created for such scalars for each copy of the loop body. Statements that define or use scalars with overlapping live ranges are converted into case statements. For ith case, (i+j)th instance of the scalar variable is used in jth copy of the loop body, for example, as shown in FIG. 1. A variable is defined that acts as counter starting with 0 till ceil(L/I–1).

Moreover, states from 0 to L–I–1 of the pipeline schedule comprises the prologue of the pipeline; states from L–I to L–1 comprise the kernel of the pipeline. The rest of the states are the epilogue of pipeline. Index variable and modulo variable are initialized at beginning of the pipeline kernel. Modulo variable is incremented at the last state of kernel. The index variable is incremented till n−Ceil(L/i)+1, where n is bound of the origin at loop. If index variable is less than n−Ceil(L/i)+1, the state machine loops back to the first statement of the kernel; else the state machine jumps to the first statement of the epilogue.

Once the pipeline schedule is constructed, VHDL or Verilog code is generated from the schedule and added to the VHDL or Verilog AST. For each node, the basic statement is VHDL. Predicate list of the node is checked, and if predicate expressions exist, then the expressions are ANDed to form a single condition, which guards the execution of the basic statement of the node. All nodes assigned a state are associated in a single state of VHDL AST; see FIG. 20, for example. The last statement of the kernel has a conditional statement depending on index variable count that decides the next state. For the rest of the states, the next state is the state that follows immediately.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by claims following.

What is claimed is:

1. A method for compiling a functional description expressed in an interpretive, algorithmic language into target code for selected hardware, the method comprising the steps of:
   parsing the functional description expressed in the interpretive, algorithmic language with at least one variable of unknown type or dimension into an abstract syntax tree;
   inferring a type and dimension for the variable of unknown type or dimension by analyzing the usage of the variable of unknown type or dimension in the abstract syntax tree;
   assigning the inferred type or dimension to the variable of unknown type or dimension;
   transforming compound statements in the abstract syntax tree into a series of single statements; and
   translating the abstract syntax tree into a register transfer level format.

2. The method for compiling a functional description of claim 1, further comprising the steps of:
   receiving a user directive file including at least one user defined directive selected from the group consisting of constraint directives, assertions, and compiler hints; and
   annotating the functional description according to the user directive file.

3. The method for compiling a functional description of claim 1, further comprising the steps of:
   analyzing a value range of the at least one variable of unknown type or dimension; and
   assigning a required precision for the at least one variable of unknown type or dimension.

4. The method for compiling a functional description of claim 3, further comprising the step of:
   parsing a real variable of unknown type or dimension into an integer part and a fractional part, wherein said real variable of unknown type or dimension is one of said at least one variable of unknown type or dimension.

5. The method for compiling a functional description of claim 1, further comprising the steps of:
   analyzing array access patterns across loop iterations; and
   replacing a statement in a loop including a memory access with multiple statements including the memory access to reduce the number of individual memory accesses.

6. The method for compiling a functional description of claim 1, further comprising the steps of:
   analyzing compound loop structures to identify pipeline opportunities; and
   applying the pipeline algorithm to pipeline opportunities to generate nodes corresponding to the loop body, predicate nodes corresponding to loop conditional statements, and a schedule for scheduling pipeline operations.

7. The method for compiling a functional description of claim 1, wherein the step of transforming compound statements in the abstract syntax tree into a series of single statements comprises the step of:
   expanding a matrix operation into at least one loop.

8. The method for compiling a functional description of claim 1, wherein the step of transforming compound statements in the abstract syntax tree into a series of single statements comprises the step of:
   deconstructing a compound statement into at least one simple statement.

9. A system for compiling a functional description expressed in an interpretive, algorithmic language into target code for selected hardware comprising:
   a parser for parsing the functional description expressed in the interpretive, algorithmic language with at least one variable of unknown type or dimension into an abstract syntax tree;
   a type-shape analyzer, coupled to the parser, for inferring a type and a dimension to the variable of unknown type or dimension by analyzing use of the variable of unknown type or dimension in the abstract syntax tree;
   a statement deconstructor, coupled to the type-shape analyzer, for transforming a compound statement in the abstract syntax tree into at least one simple statement; and
   a translator, coupled to the statement deconstructor, for translating the abstract syntax tree into a register transfer level format.

10. The system for compiling a functional description of claim 9, further comprising:
    a user directive file, coupled to the parser, for annotating the functional description with at least one user defined directive selected from the group consisting of constraint directives, assertions, and compiler hints.

11. The system for compiling a functional description of claim 9, further comprising:
    a precision analyzer, coupled to the type-shape analyzer, for determining the precision of the at least one variable of unknown type or dimension.

12. The system for compiling a functional description of claim 11, further comprising:
    a real number parser, coupled to the precision analyzer, for parsing a real number into an integer part and a fractional part.

13. The system for compiling a functional description of claim 9, further comprising:
    a memory access optimizer, coupled to the statement deconstructor, for analyzing array access patterns across loop iterations and replacing a statement in a loop including a memory access with multiple statements including the memory access to reduce the number of individual memory accesses.

14. The system for compiling a functional description of claim 9, further comprising:
    a pipeline optimizer, coupled to the statement deconstructor, for analyzing compound loop structures to identify pipeline opportunities and applying the pipeline algorithm to pipeline opportunities to generate nodes corresponding to the loop body, predicate nodes corresponding to loop conditional statements, and a schedule for scheduling pipeline operations.

15. The system for compiling a functional description of claim 9, wherein the statement deconstructor for transforming a compound statement in the abstract syntax tree into at least one simple statement comprises:
a scalarizer, coupled to the type-shape analyzer, for expanding a matrix operation into at least one loop.

16. One or more computer readable storage devices having computer readable code embodied on said computer readable storage device, said computer readable code for programming one or more computers to perform a method for compiling a functional description expressed in an interpretive, algorithmic language into target code for selected hardware, the method comprising the steps of:
parsing the functional description expressed in the interpretive, algorithmic language with at least one variable of unknown type or dimension into an abstract syntax tree;
inferring a type and dimension for the variable of unknown type or dimension by analyzing the usage of the variable of unknown type or dimension in the abstract syntax tree;
assigning the inferred type and dimension to the variable of unknown type or dimension;
transforming compound statements in the abstract syntax tree into a series of single statements; and
translating the abstract syntax tree into a register transfer level format.

17. The method of claim 16, further comprising the steps of:
receiving a user directive file including at least one user defined directive selected from the group consisting of constraint directives, assertions, and compiler hints; and
annotating the functional description according to the user directive file.

18. The method of claim 16, further comprising the steps of:
analyzing a value range of the at least one variable of unknown type or dimension; and
assigning a required precision for the at least one variable of unknown type or dimension.

19. The method of claim 16, further comprising the steps of:
analyzing array access patterns across loop iterations; and
replacing a statement in a loop with a memory access with multiple statements with the memory access to reduce the number of individual memory accesses.

20. The method of claim 16, further comprising the steps of:
analyzing compound loop structures to identify pipeline opportunities; and
applying the pipeline algorithm to pipeline opportunities to generate nodes corresponding to the loop body, predicate nodes corresponding to loop conditional statements, and a schedule for scheduling pipeline operations.

* * * * *

UNITED STATES PATENT AND TRADEMARK OFFICE
CERTIFICATE OF CORRECTION

PATENT NO. : 7,000,213 B2  Page 1 of 1
APPLICATION NO. : 09/770541
DATED : February 14, 2006
INVENTOR(S) : Banerjee et al.

It is certified that error appears in the above-identified patent and that said Letters Patent is hereby corrected as shown below:

Column 3,
Line 35, delete "operation one" and insert -- operation, one --.
Line 38, delete "brokendown" and insert -- broken down --.

Column 5,
Line 15, after "MATLAB" insert -- . --.

Column 6,
Line 34, delete "know" and insert -- known --.

Column 10,
Line 52, delete "comprises" and insert -- comprise --.

Signed and Sealed this

Twentieth Day of June, 2006

JON W. DUDAS
*Director of the United States Patent and Trademark Office*